United States Patent [19]
Nakasuji et al.

[11] Patent Number: 6,140,021
[45] Date of Patent: Oct. 31, 2000

[54] CHARGED PARTICLE BEAM TRANSFER METHOD

[75] Inventors: Mamoru Nakasuji, 2-15-11, Serigaya-chou, Kounan-ku, Yokohama-shi, Kanagawa-ken; Shintaro Kawata, Ibaragi-ken, both of Japan

[73] Assignee: Mamoru Nakasuji, Yokohamashi, Japan

[21] Appl. No.: 09/307,204

[22] Filed: May 7, 1999

[30] Foreign Application Priority Data

May 8, 1998 [JP] Japan .............................. H10-140456

[51] Int. Cl.[7] ...................................................... G03C 5/00
[52] U.S. Cl. ............................................ 430/296; 430/942
[58] Field of Search ...................................... 430/296, 942

[56] References Cited

U.S. PATENT DOCUMENTS

| | | | |
|---|---|---|---|
| 5,798,194 | 8/1998 | Nakasuji | 430/296 |
| 5,817,442 | 10/1998 | Okino | 430/296 |
| 5,876,881 | 3/1999 | Kawata | 430/296 |
| 5,989,753 | 11/1999 | Okino | 430/296 |

*Primary Examiner*—Christopher G. Young

[57] ABSTRACT

This invention provides the charged particle beam transfer method, which can control adverse effect of distortion or blur that arises from the space charge effect due to the non-uniform pattern density to a minimum.

A pattern formed on reticle is raster or step-and-repeat scanned with a charged particle beam and is illuminated in consecutive order, and a pattern image of a sub-field, which is illuminated, is to be formed on a certain position of a radiation sensitive substrate. On the radiation sensitive substrate whole pattern is projected through stitching the said pattern image. The pattern is to be divided into plural areas A and B which differ in pattern density one another, and the above-described scan boundary is made to coincide with the boundary of these plural areas.

20 Claims, 7 Drawing Sheets

CHARGED PARTICLE BEAM TRANSFER METHOD

FIELD OF THE INVENTION

This invention pertains to a charged particle beam transfer method, in which pattern on reticle is projected on a radiation sensitive substrate (such as wafer) by charged particle beam s. The method is suitable for forming fine and high-density pattern as fine as 100 nm or below, with high throughput and formed pattern's accuracy. This invention relates, in particular, to the charged particle beam transfer method that can control adverse effect of distortion or blur of pattern that arises from space charge effect under non-uniform pattern density.

BACKGROUND OF THE INVENTION

There has been proposed a charged particle beam transfer method wherein a pattern formed on reticle in a divided state into many sub fields is illuminated in consecutive order through raster or step-and-repeat scanning with a charged particle beam. Therein a pattern image of the illuminated sub field is to be projected on a certain position of a radiation sensitive substrate. The whole pattern is projected through stitch the sub field pattern images together on a radiation sensitive substrate. (U.S. Pat. No. 5,260,151, etc.) Also, there has been proposed two types reticles, the one is scattering a membrane reticle which provides pattern layer consisting of patterned scattering layers on a thin membrane that transmits most of electron beam, and the other is a stencil reticle which have a pattern holes on a membrane. (U.S. Pat. No. 5,130,213, etc.) Electron beams scattered by the scattering area cannot pass through the contrast aperture (crossover aperture) which is disposed in the projection optics of the exposure system. The patterned beams that have passed through the aperture form a demagnified projection image of the pattern on the wafer.

In the charged particle beam transfer method which for such fine pattern projection as above-described, beam blurs and projection images distort due to the space charge effect, when a beam current is made larger in order to raise throughput. Particularly, when pattern density is not uniform in a sub field, the above-described distortion or blur comes larger and lowers the projection accuracy.

SUMMARY OF THE INVENTION

It is a purpose of the invention to provide a charged particle beam transfer method, in which adverse effect of the distortion, or blur of a pattern that arises from the space charge effect can be suppressed. The method is also suitable for forming fine and high-density pattern as fine as 100 nm or under with high throughput and pattern forming accuracy.

The charged particle beam transfer method of the first embodiment of this invention comprises the steps of:

(a) forming a pattern to be projected on a magnified reticle, the reticle is divided into plural stripes which have a longer side and a shorter side and where a reticle stage and a substrate stage are moving continuously along the longer side dimension during projection, each stripe is further divided into plural main fields of the charged particle beam optical system, and the longer side of the main field is the same as the shorter side of the stripe, each main field includes plural sub-fields (b) scanning the pattern formed on the reticle in raster or step-and-repeat manner with the charged particle beam being to illuminate each sub-field one by one, wherein a pattern image of the illuminated sub-field is formed on a certain position of a radiation sensitive substrate, (c) thus projecting the whole pattern through stitching the pattern images of the sub-fields on the radiation sensitive substrate, wherein the above-described pattern is divided into plural areas whose pattern density differs one another; and the boundaries of these areas coincide those of the above-described scanning or sub field.

If the difference in pattern density in a sub field is as small as possible, the distortion and blur of projected pattern are controlled to be minimum. The raster scan is in the meaning of scanning beam continuously on a reticle or a wafer, while step-and-repeat scanning, in the meaning of intermittently scanning beam on a reticle or a wafer.

In the charged particle beam transfer method, it is better that the above-described sub field size should be nearly constant in each area divided according to the pattern density. This will require no frequent modification of the sub-field size and help easy control.

In the charged particle beam transfer method, it is better that the size of the beam that illuminates a reticle should be fixed constant at the time of exposure on plural areas which differ in the above-described pattern density. It requires no complicated charged particle beam optics to change the illumination beam size, and it takes extra time for beam size changing. In this respect, a beam size is fixed and the strut pitch of a reticle is designed to be constant by changing a skirt size on a reticle.

In the charged particle beam transfer method, it is better that the plural main field should be arranged on a reticle at a certain pitch and that this pitch should be fixed even between and among plural areas which differ in the above-described pattern density. If the main field pitch on a reticle is to be changed, it requires a reticle whose strut pitch is different, and it will cause a problem of making designing and manufacturing of a reticle more complicated. In this respect the main field pitch on a reticle is preferably fixed to standardize a reticle.

In the charged particle beam transfer method, it is better that the above-described reticle should be equipped with plural thin membrane regions having the above-described main field and skirt, and the reticle should be also equipped with struts which surround the membrane regions, and that the above-described main field should be formed in the center of struts. This will make strut pitch on a reticle fixed, illumination beam fixed, and variable sizes of a sub field attained.

In the charged particle beam transfer method, the plural main fields each of which an illumination beam scans by deflection should better be provided with a same pitch on the reticle. The X-dimension size of a sub field should also preferably be made almost equal in each area divided according to the pattern density when the main field is exposed by step-and-repeat scanning. This will standardize the X-dimension strut pitch of reticle.

In the charged particle beam transfer method, it is better that: (a) the plural main fields each of which an illumination beam scans by deflection should be provided at a certain pitch, (b) the main field should be divided into plural sub fields which are exposed in consecutive order by step-and-repeat scanning in the main field, (c) a skirt and strut should be provided between and among each sub field, (d) and that the sub field should be formed in the center of a thin membrane consisting of a sub field and a skirt surrounding it. This will enable to illuminate the pattern area without trouble even though an illumination beam has a small position error on a reticle, and to protect strut from being heated up through beam radiation on the strut.

The charged particle beam transfer method of the second embodiment of this invention comprising the step of:
(a) forming a pattern to be projected on a magnified reticle, the reticle is divided into plural stripes which have a longer side and a shorter side and where a reticle stage and a substrate stage are moving continuously along the longer side dimension during projection, each stripe is further divided into plural main fields of the charged particle beam optical system, and the longer side of the main field is the same as the shorter side of the stripe, each main field includes plural sub-fields
(b) scanning the pattern formed on the reticle in raster or step-and-repeat manner with the charged particle beam being to illuminate each sub-field one by one, wherein a pattern image of the illuminated sub-field is formed on a certain position of a radiation sensitive substrate,
(c) thus projecting the whole pattern through stitching the pattern images of the sub-fields on the radiation sensitive substrate, wherein
the method levels the difference of pattern density in scanning direction, or converts the distortion of projected image that arises from the difference of pattern density into blur.

A charged particle beam transfer method of the third embodiment comprising the step of:
(a) forming a pattern to be projected on a magnified reticle, the reticle is divided into plural stripes which have a longer side and a shorter side and where a reticle stage and a substrate stage are moving continuously along the longer side dimension during projection, each stripe is further divided into plural main fields of the charged particle beam optical system, and the longer side of the main field is the same as the shorter side of the stripe, each main field includes plural sub-fields
(b) scanning the pattern formed on the reticle in raster or step-and-repeat manner with the charged particle beam being to illuminate each sub-field one by one, wherein a pattern image of the illuminated sub-field is formed on a certain position of a radiation sensitive substrate,
(c) thus projecting the whole pattern through stitching the pattern images of the sub-fields on the radiation sensitive substrate, wherein
the longer side main field size is determined as follows the X-direction length of the chip is divided by integer and is to be selected from the sizes which are smaller than the maximum optical main field size of a charged particle beam system and closest to it.

DETAILED DESCRIPTION OF A PREFERRED EMBODIMENT

The following are explanation with the drawing being referred to.

Figure 7:
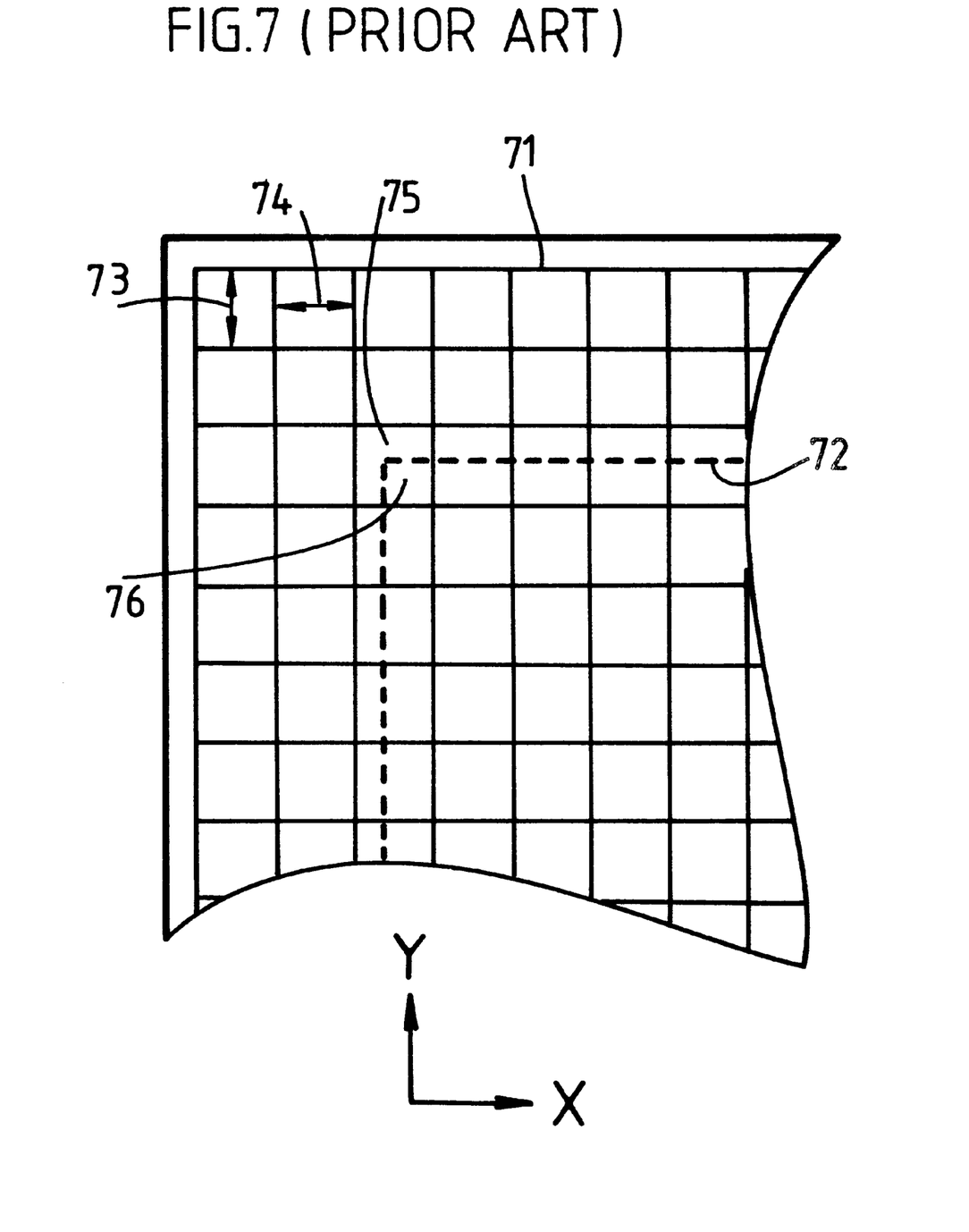
FIG. 7 is a plan view that shows an example of the division of chip patterns on a wafer in a prior art of a charged particle beam exposure method.

FIG. 7 shows a prior art for a charged particle beam transfer method. Pattern area 71 consists of sparse area (outside of the boundary 72) and a dense area (inside of the boundary 72). Whole pattern area 71 is divided into sub field whose size 73 and 74 is constant all over the pattern area. As a result, there are sparse area 75 and the dense area 76 in one sub field. The pattern image from the sparse area 75 is focused at near reticle side position. On the other hand, the pattern images from the dense area 76 are focussed at farther position beyond the wafer. Only one focus condition can be given for one sub field projection, therefore precise pattern can not be obtained on the sub field around the boundary 72.

Figure 5:
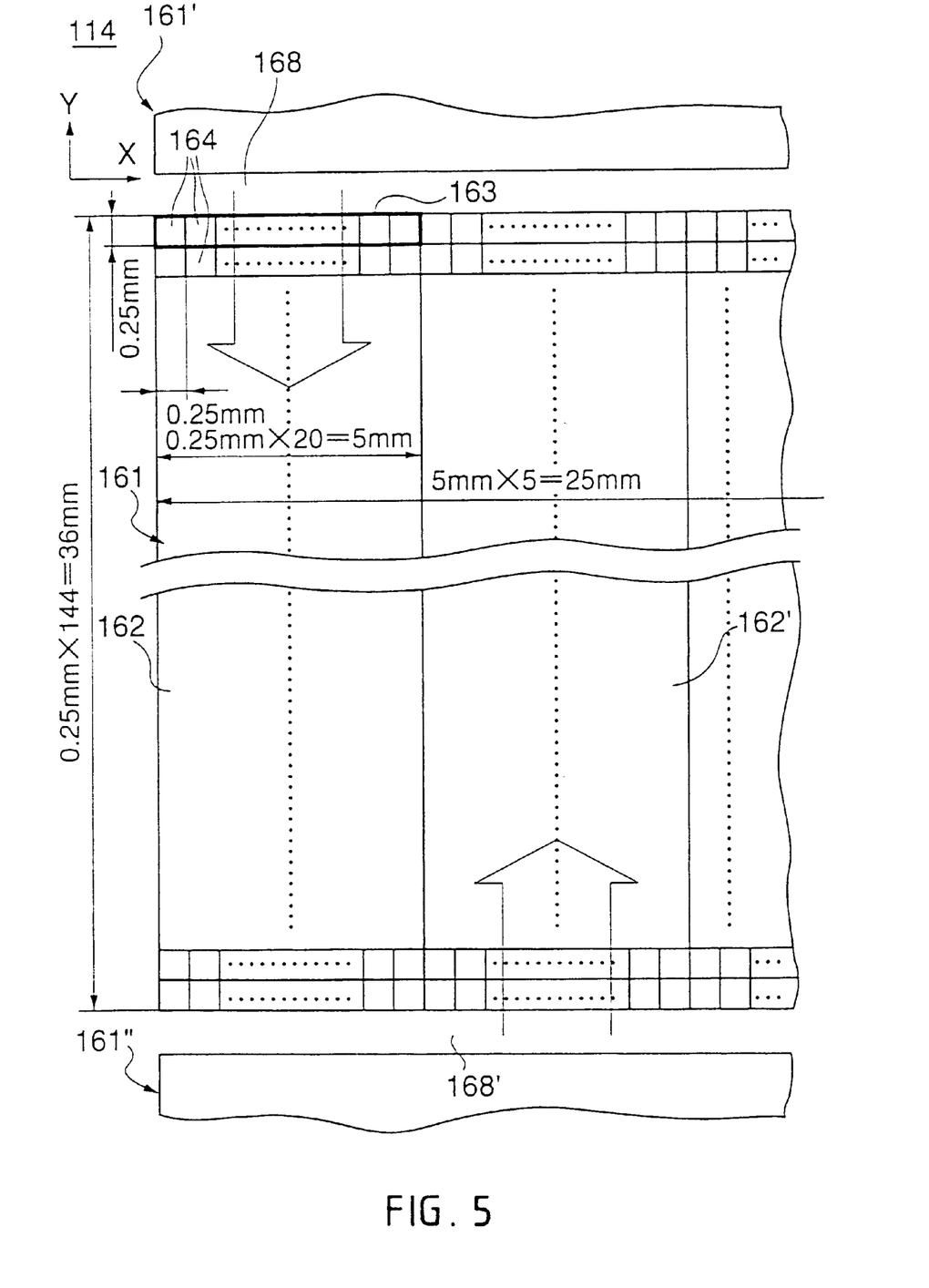
FIG. 5 is a plan view that shows an example of the division of chip patterns on a wafer in an embodiment of a charged particle beam exposure method.

FIG. 5 is the plan view to show the divided chip pattern on a wafer of the semi-conductor device projected by the charged particle beam relating to this invention. For example, put the vertical direction in the FIG. 5 as Y direction and horizontal direction, X direction. In the center of the figure is shown chip pattern 161 and above and below it are shown chip patterns 161' and 161". Between each chip pattern, about 0.1-mm wide scribe lines 168 and 168' are provided.

In this case, the size of whole chip pattern 161 is 25 mm (X-dimension)×36 mm (Y-dimension). Here, chip pattern 161 is divided into a number of small regions 164 (which is called as sub field of 0.25-mm square in the maximum). The main field 163 (surrounded by thick lines) is divided into 20 pieces of a sub field 164 in X direction. The main field 163 is arranged in Y direction into 144 columns and it composes stripe 162. In this chip pattern the whole part is not illustrated, however, there are 5 strips 162 in X direction. That is, the sub fields 164 are arranged in the chip 144 pieces in Y direction and 20×5=100 pieces in X direction.

The sub field size on the reticle is 1 mm×1 mm. Further, in case that each sub field 164 is step-and-repeat scanned and exposed, 0.1 mm wide skirt (0.2 mm wide in total) is provided in frame-shape to surround each sub field 164 on the reticle. Also, struts (0.1 mm wide, for example) is provided for reinforcement between the main fields and between sub fields. Accordingly, the size of one chip pattern on the reticle in this case is 1.3×100=130 mm in X direction and 3×144=187.2 mm in Y direction. In the case where each sub field 164 is raster scanned and exposed, a skirt and a strut between sub fields in X-dimension is not to be provided.

When the chip pattern 161 of FIG. 5 is projected, the electron beam irradiates a sub field on a reticle, and in one main field 163 should be deflected mostly in X direction. And the patterned beam that passed through the sub field should be directed to form into image on wafer on which the sub field is to be projected. The scanning in the main field 163 should be done by a magnetic deflector.

A reticle stage and a substrate stage are moving continuously along the longer side dimension of the stripe during projection. The image gets reversed because of projection lens, and therefore moving direction of each stage is also opposite. Accordingly, while the main field is projected, each sub field on a reticle keeps moving in Y direction and the sub field on a wafer to be projected also keeps moving in Y direction. For such move in Y direction, an illumination beam and a projection beam should be tracked to follow it. Before the next stripe 162 is exposed, the exposure should temporarily halted to transfer the reticle stage and the wafer stage in X direction.

Figure 6:
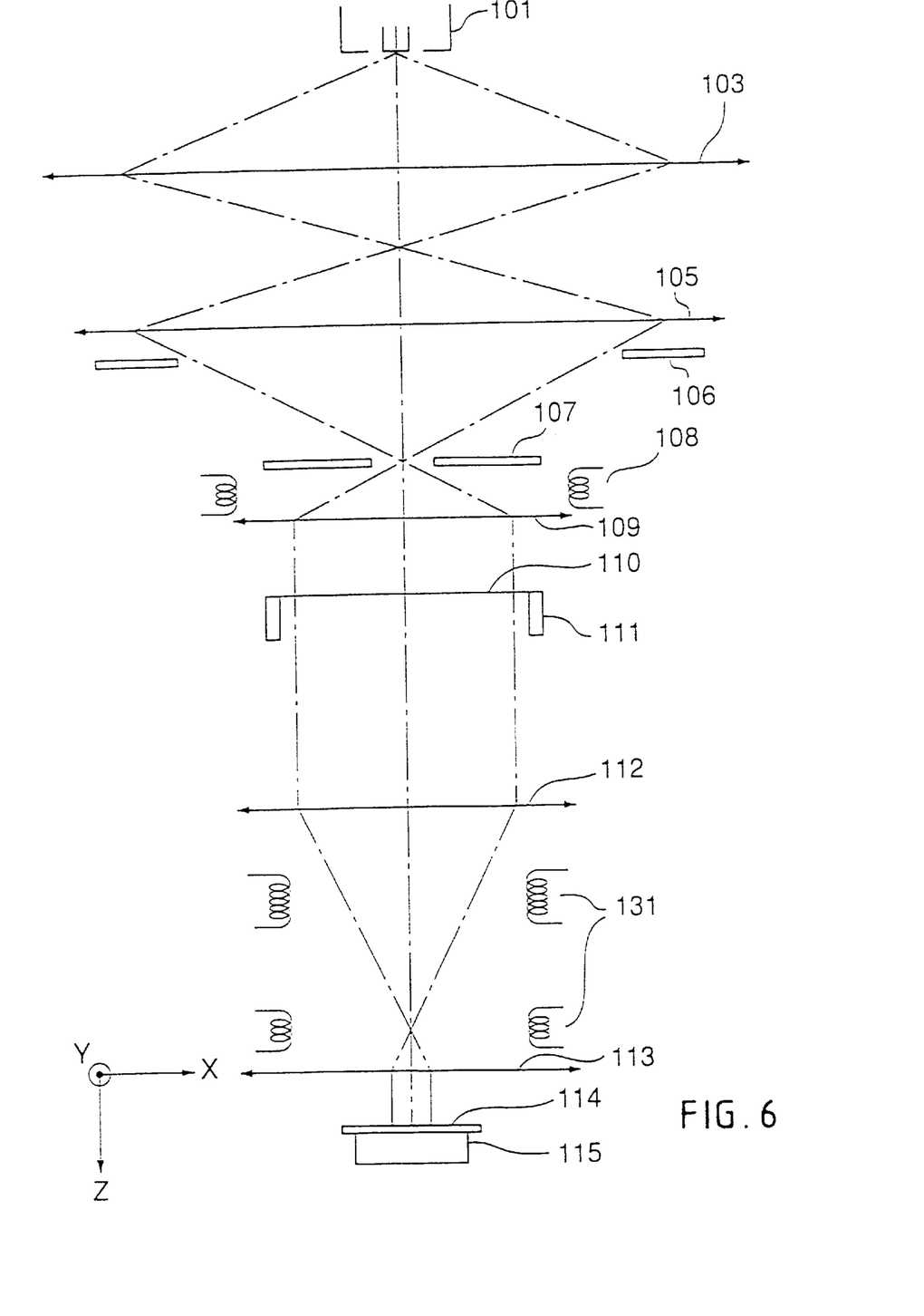
FIG. 6 is a drawing that shows the whole optics of the electron beam exposure system relating to the embodiment of this invention.

FIG. 6 shows the whole optics of the electron beam exposure system relating to an actual example of this invention. The electron gun emits electron beam downward. The 2-staged condenser lenses 103 and 105 are provided below electron gun 101, and electron beam passes through these condenser lenses forming an image of crossover on the blanking aperture 107.

The square aperture 106 is provided below the condenser lens 105. This square aperture 106 passes only an electron beam enough to cover an area equivalent to a sub field. In the concrete, the aperture 106 forms the illumination beam into a 1.05-mm square on the reticle.

The blanking aperture 107 is provided below the aperture 106 at the position where crossover is formed. The deflector 108 is provided below it. This deflector mainly scans the illumination beam in consecutive order in X direction of FIG. 5 and illuminates each sub-field in the main field on the reticle. The condenser lens 109 is provided below the deflector 108. The condenser lens 109 makes the electron beam a parallel beam, and forms an aperture image on the reticle 110.

In FIG. 6 only one sub field on a reticle around the optical axis is illustrated, however, the reticle actually expands in vertical direction of the optical axis and, as explained in FIG. 5, has many sub fields. To expose all sub fields in the main field, the deflector 108 shall deflect the electron beam. Also the reticle 110 is placed on the reticle stage 111 which is movable in X and Y directions. And, the wafer 114, which is the target to be exposed on, is placed on the wafer stage 115 which is movable in X and Y directions. Each main field of the stripe 162 in the chip pattern 161 of FIG. 5 is continuously exposed by scanning these reticle stage 111 and wafer stage 115 in Y direction which is reverse direction to each other. Further, by scanning both stages 111 and 115 intermittently, each stripe 162 is exposed. Both stages 111 and 115 are equipped with accurate position measurement system using laser interferometer and each sub field is accurately stitched on wafer 114 by adjusting the means of an adequate alignment and each deflector 131.

Projection lenses 112 and 113 and the deflector 131 are provided below the reticle 110. When one of the sub fields on reticle 110 is electron beam illuminated, the patterned electron beam by the reticle 110 is reduced by the projection lenses 112 and 113 and at the same time deflected to form on a certain position of wafer 114. The wafer 114 has been coated with a proper resist and the resist is exposed with electron beam, and thus reduced reticle image is projected on the wafer 114. As mentioned above, the wafer 114 is placed on the wafer stage 115, which is movable in the X and Y direction.

Figure 1:
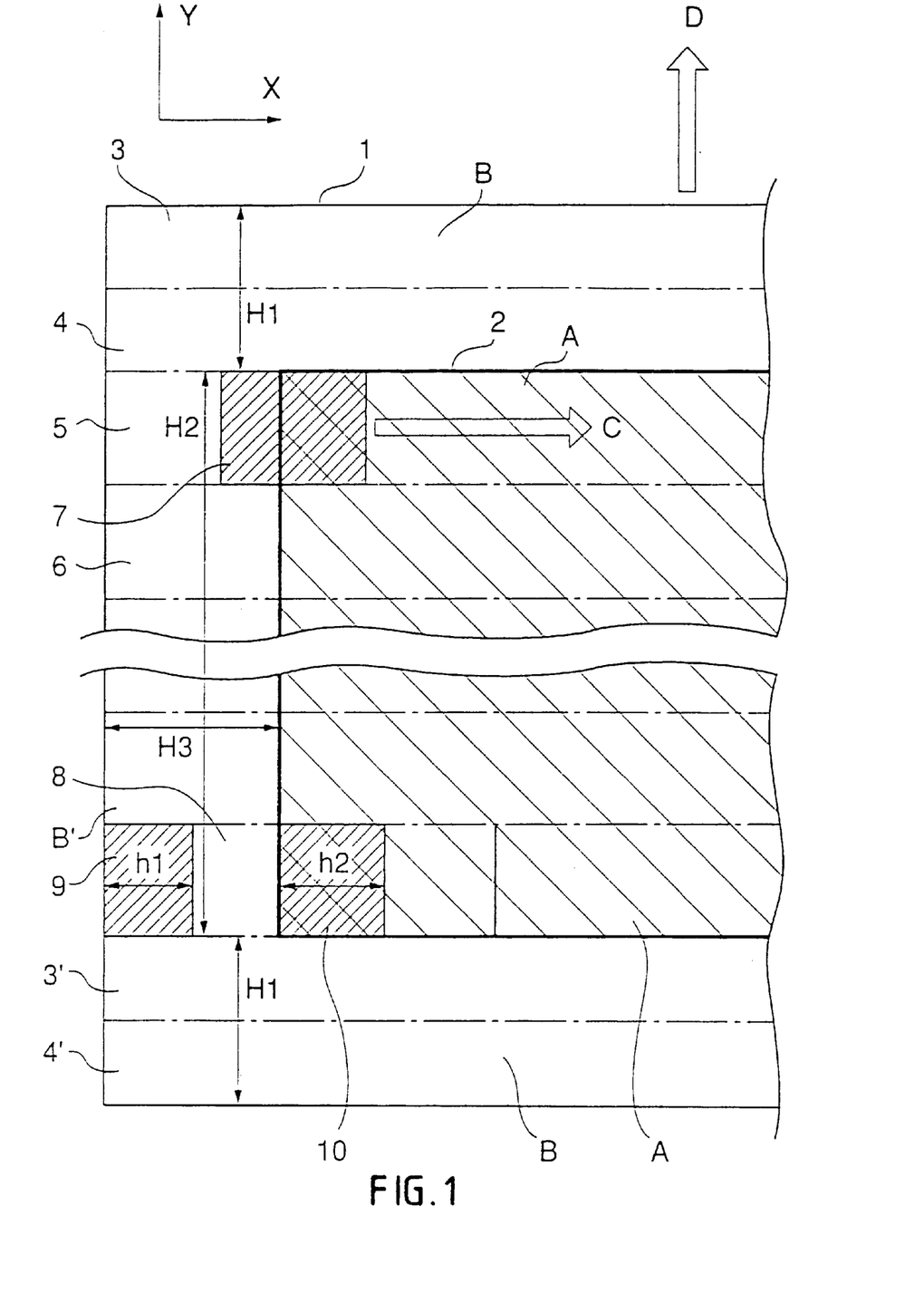
FIG. 1 is a typical plan view of semi-conductor device pattern to explain actual example of the first embodiment of this invention.

Now, let us explain the charged particle beam transfer method of the first embodiment of this invention. FIG. 1 is a typical plan view of semi-conductor device to explain the charged particle beam transfer method relating to the first embodied example of this invention. This figure is drawn with a projection pattern image on a wafer in mind. This figure illustrates a memory device pattern 1. The central area covered with wide-set oblique lines surrounded by pattern density boundary 2 shown in thick solid lines is the high density area A where memory cells are to be provided. The outside of the line 2 is the peripheral circuit's area and is the area B of comparatively low density.

This memory device pattern is divided, as described above referring to FIG. 5, into plural main fields 3, 4, 5 or 6 (163 of FIG. 5) in Y direction, and each main field is exposed in raster or step-and-repeat method. The areas 7 and 9 in the figure, which are covered with thin oblique lines, are sub-fields. During exposure, the scanning in X-direction in each main field 3, 4, 5 or 6 should be done by magnetic deflection of the beam. For the transfer between main fields, a reticle stage and a wafer stage are to be moved continuously in the opposite direction.

The area where deflection is possible is limited due to the characteristic of electron beam optics. Therefore, in order to expose an area wider than the main field, a reticle stage and a wafer stage should be moved by step way in X direction.

In the specifications hereof, the optical field area where electron beam scanning is possible by a magnetic deflector with a reasonable aberrations, and the pattern area where projection is possible by such scanning, are called the main field. On the other hand, a unit exposure area which is exposed for one time in step-and-repeat scanning way or area where an illumination beam or a projection beam irradiates instantaneously when it is exposed in raster-like scanning way is called the sub-field. In regard to this sub-field, there are two cases where this means the maximum optical sub-field size and where it means the unit pattern area to be exposed on a reticle or the image of a projected pattern on a wafer.

The maximum optical sub-field is that of optical sub-field that satisfies aberration requirements after the dynamic aberration compensation for electron optics (compensation to make a lens or an aberration correction deflector most suitable for the sub-field at that time) is done. The maximum optical main field size is that of the main field size within the limit in which the aberration can be corrected by the dynamic compensation for each sub-field.

The main field size of the projection system is determined as follows. The X direction length of the chip pattern is divided by integer and is to be selected from the size which is smaller than the maximum optical main field size and that it is closest to it. This size becomes the X-direction size of the stripe. As the Y direction size of main field also becomes the sub-field size, it should be smaller than the maximum optical sub-field size and that it should be selected so that it comes closest to it.

The Y direction size of the main field is made different in this invention between a low-density area B and a high-density area A, and further, in each area B and A it is made nearly identical. As far as the low density area B is concerned, the size of each main field 3 and 4 is made to be $H_1/2$, which are obtained from dividing H1, Y direction length of the low density area B, by 2. In regard to the high density area A, the value obtained by dividing the size of the area H2 by integer is selected, which is moreover smaller than the maximum optical sub-field size and that the value is closest to it. Generally H2 is considerably larger than the size of the maximum sub-field, and therefore, the Y direction size of main fields 5 and 6 of high density area A comes close to the maximum optical sub field size.

By selecting each main field width as described above in the mixed region of high density area A and low density area B, the boundary 2 of both areas A and B was made to coincide with the boundary of the main fields 4 and 5 (or that of the main fields 9 and 3'). As a result, the difference in pattern density in the main field can be kept relatively small, and distortion or blur of the pattern can be controlled to make it small.

The rectangle that is covered with oblique lines in the main field 5 is the infinitesimal projection beam projected on a wafer and also is the raster scanning beam 7. The characteristic feature of the beam 7 of this embodiment is that it becomes a rectangle whose longer side is in the beam scanning direction (X direction). By so doing, as mentioned later in detail with FIGS. 3 and 4 being referred to, it makes non-uniformity of pattern density in X direction small and keeps the effect of non-uniformity to a minimum.

Next, the case where the main field is scanned in step-and-repeat method, is studied, referring to the main field 8 of the lower position of FIG. 1. In this case, the main field 8 is also to be exposed in step-and-repeat method in every sub field. And the X-dimension sub field size is variable. Here, the sub-field size 9 of X direction, h1, in the low density area B, is obtained by dividing the size H3 of the horizontal low density area B by integer (2 in this case). Meanwhile, the size h2 of the sub field 10 in high density region A should be one which is the value obtained from dividing the length of the memory cell area in the main field by integer, which is smaller than the maximum optical sub field size and which is closest to it.

Figure 2:
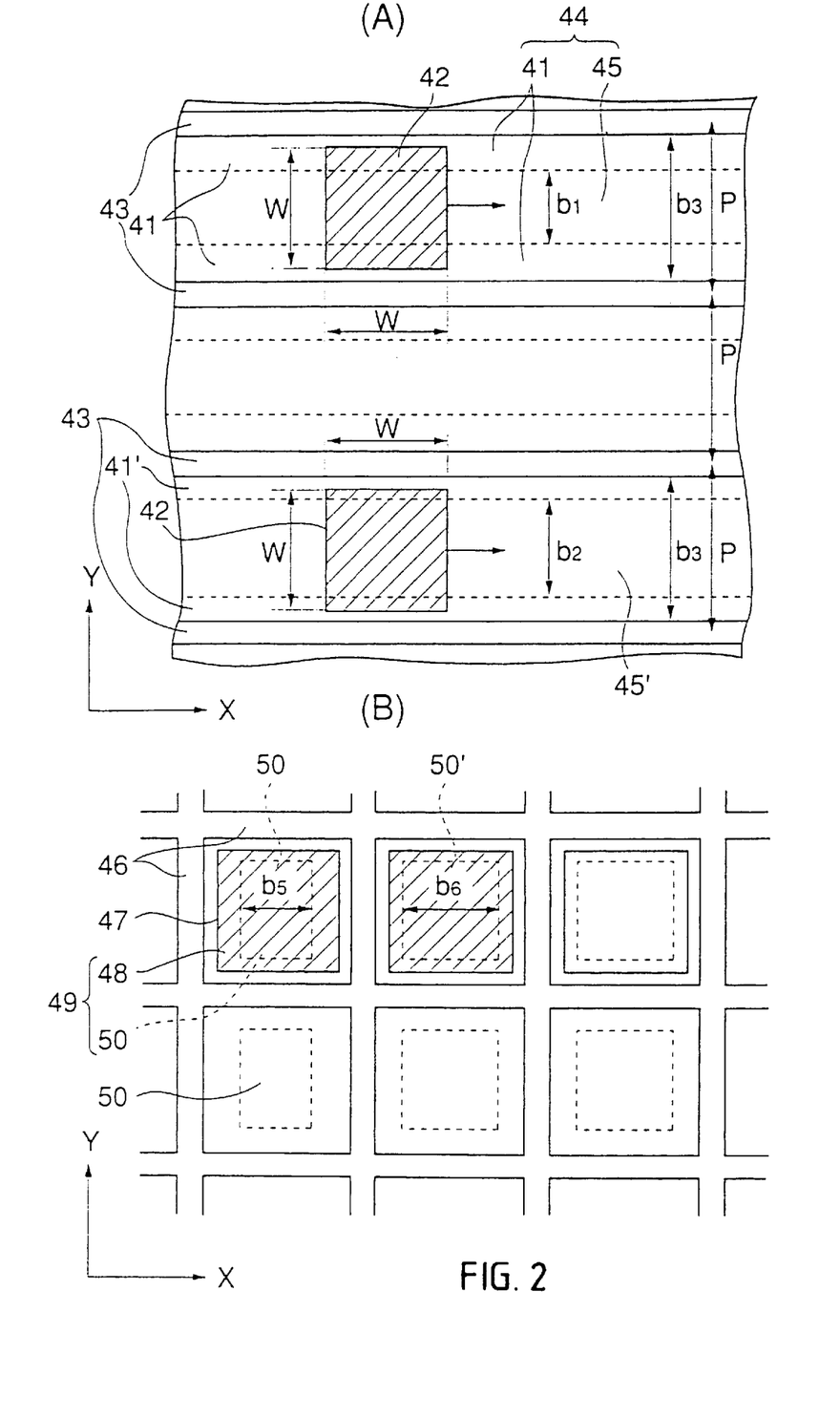
FIG. 2 is a drawing to explain the structure of a reticle and the method to radiate illumination beam when the charged particle beam transfer method described in FIG. 1 is carried out. (A) shows the case of raster scanning and (B) shows the case of step-and-repeat scanning.

FIG. 2 explains the structure of a reticle that is used in the charged particle beam transfer method illustrated in FIG. 1 and the size of illumination beam. (A) is in the case of the raster scanning and (B), the step-and-repeat scanning case. On the reticle, many struts 43, which extend in parallel in X direction are formed. This strut 43 is the reinforced structure for self-sustain and its height is about 1 mm. About 2 $\mu$m thick membrane area 44 is formed in band shape extending in X-direction between neighboring struts 43. This membrane area 44 is divided into the central pattern area (main field) 45 and the skirt area 41 above and below it. With the pattern area 44, semi-conductor device circuit pattern is formed. This reticle is manufactured by etching a single crystal Si substrate.

The beam 42 that illuminates reticle is, in this case, a W square. The size W of the beam is wider than the size b1 of pattern area 45 and narrower than the size b3 of membrane area 44. This is arranged so that all the pattern area 45 can be illuminated even though there is a small position error between beam 42 and the reticle, so that beam 42 does not radiate strut 43.

The pattern area 45 is formed in the center of the strut 43. The pattern area 45 at the top is intended to expose the main field 3 at the top of FIG. 1, while the pattern area 45 third from the top, to expose the main field 5, third from the top in the figure. And, in accordance with the difference of width of each main field 3 and 5, the width b1 of the pattern area 45 and b2 of the pattern area 45' differs. However, the pitch P between strut 43, size b3 of the membrane area and size W of beam are fixed equal. Also, the centerline of Y direction of each pattern area 45, 45' coincides that of struts 43. Why this is so provided is because it is difficult to change the illumination beam size, and it is troublesome to change strut pitch for a reticle manufacturing point of view. However, it is necessary to control projection optics so that the edge of an image in neighboring main fields on a wafer should connect one another correctly. The example of the above-described values are as follows: W=1.1 mm, b1=0.8 mm, b2=0.95 mm, b3=1.2 mm, P=1.3 mm.

For the reticle that is used in the step-and-repeat scan method, as illustrated in FIG. 2(B), strut 46 is usually formed in X and Y directions around the sub field 50 and 50' on a reticle. The square membrane area 49 is formed among this vertical and horizontal strut 46. The periphery of the membrane area 49 becomes the skirt area 48 and the central section becomes the pattern area (the sub field 50). In this example, the size b5 and b6 of each sub field are different in the neighboring sub fields 50 and 50' in X direction. This copes with the difference in the size of the sub fields 9 and 10 when the main field 8 in FIG. 1 is exposed. In this case, the strut pitch of membrane area 49 and that of an illumination beam 47 are identical.

Figure 3:
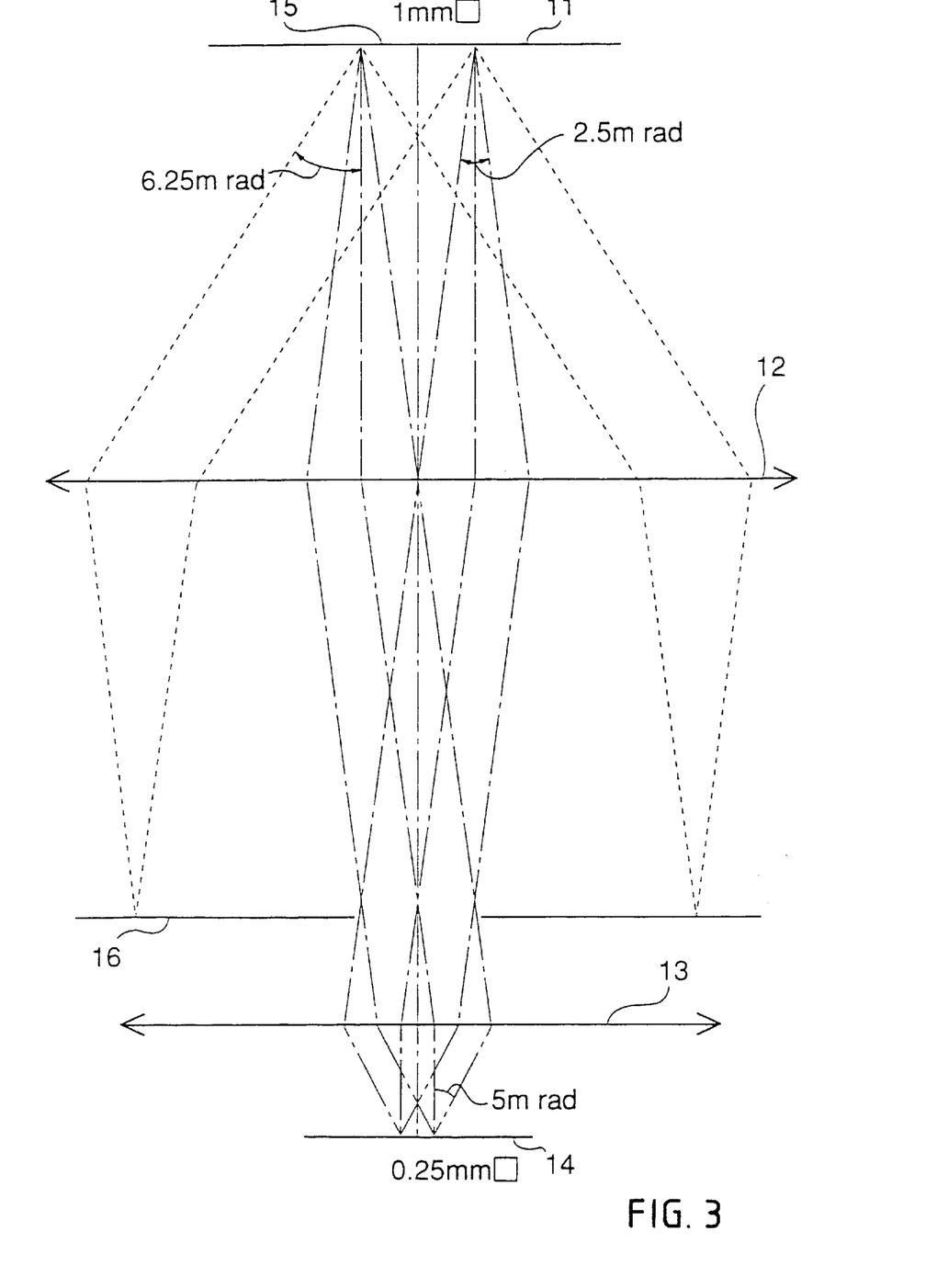
FIG. 3 is a drawing to explain the case where there is pattern non-uniformity.

FIG. 3 is drawing for the purpose of studying an issue of pattern density non-uniformity in a sub field. In the figure the chain line with a dot shows the beam or an envelope of a beam that passes through a reticle at the hole or a thin membrane. The broken line shows the envelope of a beam that has passed through the scatterer. Right after it passes through the reticle 11, beam current is distributed uniformly even though pattern density in the sub field is not uniform. As it reaches closer to the first lens 12, the difference between the broken line and the chain line with a dot become larger. After it passes through the lens, a beam that has passed through the pattern at the hole crosses each other, thus losing the uniformity gradually. At the position of the crossover aperture 16 it becomes completely uniform. Below the crossover, the beam that has passed through the scatterer is intercepted and there remains only beam that has passed through the hole or the thin membrane. The beam that passes through the crossover aperture is focused by the second projection lens 15 and forms a sub field image on the wafer 14. As it is clear from the figure, non-uniformity is seen only near the wafer 14. Even though the beam is bent here by a small angle, it immediately reaches to the wafer 14, so the distortion is small. Therefore, in the case where a beam aperture angle is set as small as 2–6 mrad and ¼ reduction, a half angle of the beam irradiation from the reticle becomes 0.5–1.5 mrad. If the beam scattering angle from the scatterer is 4–17 times that of the above-described value, it would no problem because the beam, which has passed through the scatterer and enters the wafer is ¹⁄₁₆ to ¹⁄₂₉₀. Therefore, it is good design that a half angle of scattering from the scatterer is set 2–25 mrad.

Figure 4:
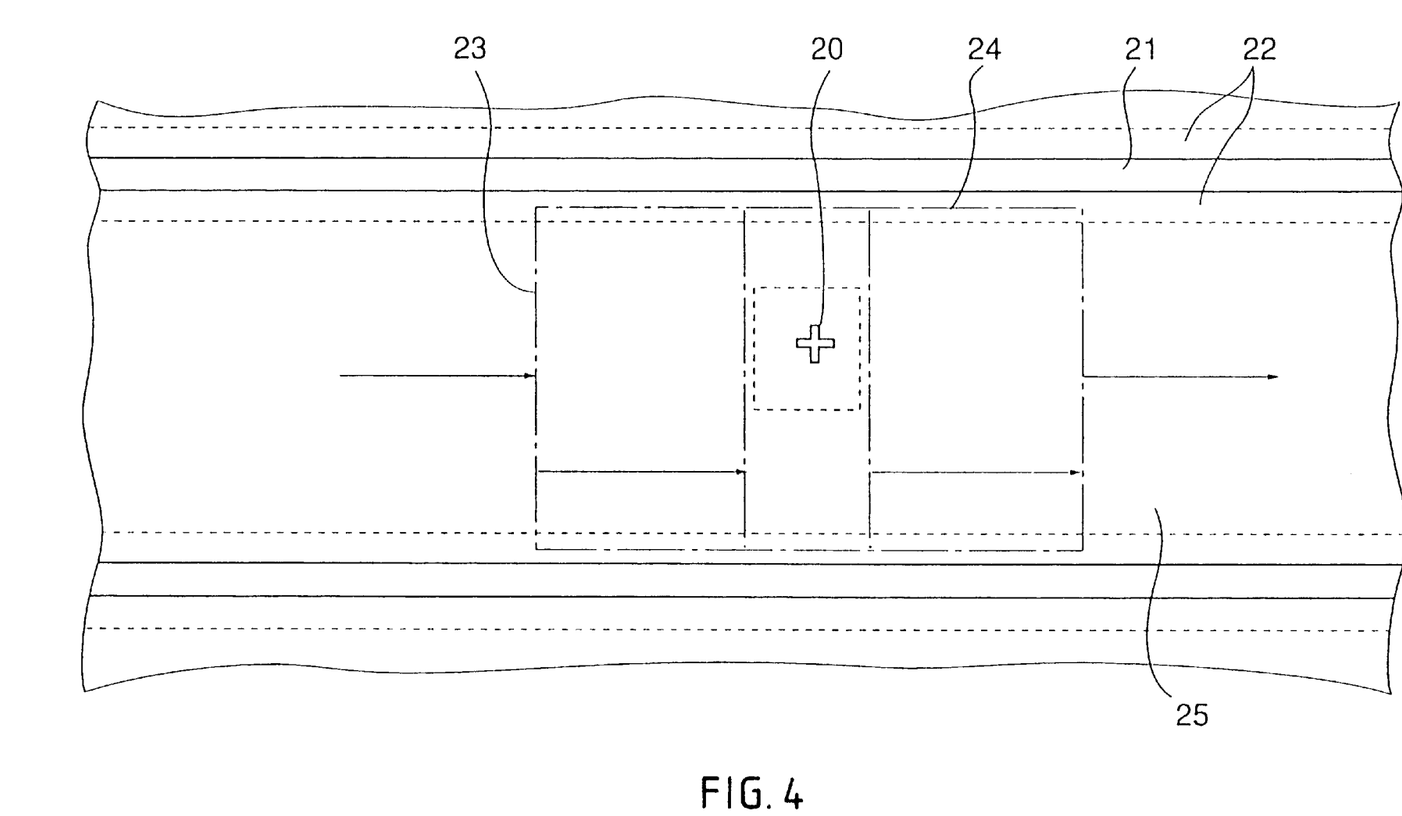
FIG. 4 is a drawing to explain that distortion is to be reduced, which arises from pattern density non-uniformity in the scanning direction when the illumination beam does raster scanning on reticle.

FIG. 4 is drawn for the purpose of explaining the distortion being reduced which is caused by the pattern density non-uniformity when the raster scanning is done with an illumination beam on a reticle, where between the struts 21 there are pattern area 25 and skirt area 22. One of the patterns 20 on a reticle is noticed, located at the right side edge of the sub field 23 when the raster-scanning beam is in a position of 23. However it will be located at the left side edge of the sub field when an illumination beam moves toward the position 24. If, for example, there is a pincushion type distortion, the pattern 20 moves toward the left side when the illumination beam is at the position of 23, and it moves toward the right side when an illumination beam is at the position of 24 because of the distortion. Therefore, the average position of pattern exposure does not change, but beam blur increases by two times of distortion value. It is said that the distortion caused by pattern density non-uniformity is converted into blur through this raster scanning. As the allowance of the beam blur is 5–10 times that of distortion, it is convenient that distortion is converted into blur.

Here follows the study of beam blur that is arisen by the space charge effect.

Up to now it has been considered good to adopt beam half angle of 6 mrad and above because the beam blur would be slight with larger beam half angle. However, when the pattern density is not uniform, the focusing point moves in the optical axis direction because of the space charge effect. In the concrete, the focusing position moves toward a reticle side where the pattern density is sparse and over the wafer side where the pattern is dense. As much blur as (out of focus value)×(aperture angle) arises because the focus condition can only be adjusted to only one condition. The blur is proportioned to aperture angle while the aberration is proportion to ½ power of aperture angle. Therefore, the blur due to the density being not uniform increases in proportion to ½ power of aperture angle. For this reason, the value smaller than 2–6 mrad is better for the most optimum aperture angle and not 6 mrad which has been considered good in the past.

As explained above, this invention provides the charged particle beam transfer method which is most suitable for forming fine- and high-density pattern of 100 nm and below in high throughput and high accuracy. It also makes it possible to reduce the adverse effect of pattern distortion and blur to a minimum that arises from the space charge effect due to the pattern density non-uniformity.

Whereas the invention has been described in connection with multiple representative embodiments, it will be understood that the invention is not limited to such embodiments. On the contrary, the invention is intended to encompass all modifications, alternations, and equivalents as may be encompassed by the spirit and scope of the invention, as defined by the appended claims.

What is claimed is:

1. A charged particle beam transfer method, comprising the steps of:
   (a) forming a pattern to be projected on a magnified reticle, the reticle is divided into plural stripes which have a longer side and a shorter side and where a reticle stage and a substrate stage are moving continuously along the longer side dimension during projection, each stripe is further divided into plural main fields of the charged particle beam optical system, and the longer side of the main field is the same as the shorter side of the stripe, each main field includes plural sub-fields,
   (b) scanning the pattern formed on the reticle in raster or step-and-repeat manner with the charged particle beam being to illuminate each sub-field one by one, wherein a pattern image of the illuminated sub-field is formed on a certain position of a radiation sensitive substrate,
   (c) thus projecting the whole pattern through stitching the pattern images of the sub-fields on the radiation sensitive substrate,
   wherein the above-described pattern is divided into plural areas whose pattern density differs one another; and the boundary of those areas coincide with that of the above-described scanning or of the sub field.

2. The charged particle beam transfer method of claim 1, wherein the shorter side length of the main field is nearly equal in each area divided according to the pattern density.

3. The charged particle beam transfer method of claim 1, wherein the illumination beam size for a reticle is made constant even between and among plural areas, where the above-described pattern density differs one another.

4. The charged particle beam transfer method of claim 1, wherein the shorter side pitch of the main field on the reticle is fixed even between and among plural areas which differ in the above-described density.

5. The charged particle beam transfer method of claim 1, wherein the maximum length of the shorter size of the main field to be 250 $\mu$m and above.

6. The charged particle beam transfer method of claim 1, wherein the main field is further divided into plural sub-fields, where the shorter size of the main field is equal to the Y-dimension sub-field size.

7. The charged particle beam transfer method of claim 6, wherein the X-dimension sub-field size is nearly constant in each area divided according to the pattern density.

8. The charged particle beam transfer method of claim 6, wherein the sub-field pitches on a reticle are constant through the pattern area.

9. The charged particle beam transfer method of claim 1, wherein the reticle is a scattering reticle which forms a pattern on a radiation sensitive substrate due to the scattering effect of the charged particle beam that a scatterer causes, and wherein the thickness of the scatterer is setting so that the scattering half angle of the charged particle beam in the scatterer becomes 2–25 mrad.

10. The charged particle beam transfer method of claim 1, wherein the method level the difference of pattern density in scanning direction or convert the projected image distortion that arises from the non-uniform pattern density in the X-direction into blur.

11. The charged particle beam transfer method of claim 1, wherein the main field size is determined as follows the X-direction length of the chip is divided by integer and is to be selected from the size which is smaller than the size of the maximum main field and closest to it.

12. A charged particle beam transfer method, comprising the steps of:
    (a) forming a pattern to be projected on a magnified reticle, the reticle is divided into plural stripes which have a longer side and a shorter side and where a reticle stage and a substrate stage are moving continuously along the longer side dimension during projection, each stripe is further divided into plural main fields of the charged particle beam optical system, and the longer side of the main field is the same as the shorter side of the stripe, each main field includes plural sub-fields,
    (b) scanning the pattern formed on the reticle in raster or step-and-repeat manner with the charged particle beam being to illuminate each sub-field one by one, wherein a pattern image of the illuminated sub-field is formed on a certain position of a radiation sensitive substrate,
    (c) thus projecting the whole pattern through stitching the pattern images of the sub-fields on the radiation sensitive substrate, wherein
    the method levels the difference of pattern density in scanning direction, or converts the projected image distortion into blur that arises from the pattern density non-uniform in the X-direction.

13. The charged particle beam transfer method of claim 12, wherein the scanning direction size of the illumination beam longer than that of its right angle direction.

14. The charged particle beam transfer method of claim 12, wherein the above-described pattern is divided into plural areas whose pattern density differs one another; and the boundary of those areas coincide that of the above-described scanning or sub field.

15. The charged particle beam transfer method of claim 12, wherein the main field size is determined as follows the X-direction length of the chip is divided by integer and is to be selected from the size which is smaller than the size of the maximum main field and closest to it.

16. A charged particle beam transfer method, comprising the steps of:
    (a) forming a pattern to be projected on a magnified reticle, the reticle is divided into plural stripes which have a longer side and a shorter side and where a reticle stage and a substrate stage are moving continuously along the longer side dimension during projection, each stripe is further divided into plural main fields of the charged particle beam optical system, and the longer side of the main field is the same as the shorter side of the stripe, each main field includes plural sub-fields, (b) scanning the pattern formed on the reticle in raster or step-and-repeat manner with the charged particle beam being to illuminate each sub-field one by one, wherein a pattern image of the illuminated sub-field is formed on a certain position of a radiation sensitive substrate, (c) thus projecting the whole pattern through stitching the pattern images of the sub-fields on the radiation sensitive substrate, wherein the main field X-dimension size is determined as follows the X-direction length of the chip is divided by integer and is to be selected from the size which is smaller than the size of the maximum optical main field and closest to it.

17. The charged particle beam transfer method of claim 16, wherein the sub-field sizes in the lower and higher density pattern regions are determined as follows, the lower and higher pattern density region lengths in the main field are divided by integers respectively and are selected from the sizes which are smaller than the maximum optical sub-field size and closest to it, respectively.

18. The charged particle beam transfer method of claim 16, wherein the Y direction size of the main field is made different in this invention between low density area B and high density area A, and further, in each area B and A it is made nearly identical.

19. The charged particle beam transfer method of claim 16, wherein the above-described pattern is divided into plural areas whose pattern density differs one another; and the boundary of those areas coincide that of the above-described scanning or sub field.

20. The charged particle beam transfer method of claim 16, wherein the method level the difference of pattern density in scanning direction or convert the projected image distortion that arises from the non-uniform pattern density in the X-direction into blur.

\* \* \* \* \*